(12) United States Patent
Yu et al.

(10) Patent No.: US 10,420,248 B1
(45) Date of Patent: Sep. 17, 2019

(54) CABLE-PROTECTING APPARATUS, CASING AND SERVER USING THE SAME

(71) Applicant: HONGFUJIN PRECISION ELECTRONICS (TIANJIN) CO., LTD., Tianjin (CN)

(72) Inventors: Mo-Ming Yu, Tianjin (CN); Jin-Liang Li, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/021,280

(22) Filed: Jun. 28, 2018

(30) Foreign Application Priority Data

Apr. 24, 2018 (CN) .......................... 2018 1 0375422

(51) Int. Cl.
  *H02B 1/20* (2006.01)
  *H05K 7/14* (2006.01)
  *H05K 7/16* (2006.01)
  *H05K 5/02* (2006.01)

(52) U.S. Cl.
  CPC ......... *H05K 7/1491* (2013.01); *H05K 5/0221* (2013.01); *H05K 7/1489* (2013.01); *H05K 7/16* (2013.01)

(58) Field of Classification Search
  USPC ................................................ 361/826, 827
  See application file for complete search history.

(56) References Cited

U.S. PATENT DOCUMENTS

| 6,747,874 B2 * | 6/2004 | McKinnon | H04Q 1/06 211/26 |
| 7,374,261 B1 * | 5/2008 | Wang | A47B 88/463 312/319.1 |
| 8,167,146 B2 * | 5/2012 | Yu | H05K 7/1491 211/175 |
| 9,750,347 B2 * | 9/2017 | Nuckolls | A47B 88/463 |
| 2009/0065658 A1 * | 3/2009 | Chen | H02G 3/0456 248/70 |
| 2009/0115300 A1 * | 5/2009 | Chen | H05K 7/1421 312/334.1 |
| 2011/0253647 A1 * | 10/2011 | Yu | H05K 7/1491 211/26 |

\* cited by examiner

*Primary Examiner* — Hung S. Bui
(74) *Attorney, Agent, or Firm* — ScienBiziP, P.C.

(57) ABSTRACT

An apparatus for protecting cables outside a server casing is between a cable managing assembly and a sliding bracket. The cable managing assembly is slidable on the bracket to allow manual operations to the server (in the working position) or can be in a nonworking position. The protecting apparatus includes locking member, latching member, and latching portion. An end of the locking member is rotatably mounted to a casing, the other end defines a locking pin. The latching member on the sliding bracket has a latching slope corresponding to the locking pin. In the working position, the latching portion and locking member can be separated, the locking member is thus released, and the sliding bracket is free to move. In the nonworking position, the latching portion resists the locking member and prevents rotation of the locking member and movement of the sliding bracket.

14 Claims, 4 Drawing Sheets

US 10,420,248 B1

CABLE-PROTECTING APPARATUS, CASING AND SERVER USING THE SAME

FIELD

The subject matter herein generally relates to cable protecting.

BACKGROUND

A data center usually includes a plurality of connectors set on the front side of the data center. Electronic devices, such as servers, arranged in the data center often include cables extending from backs of the electronic devices creating untidy runs when connected to the connectors. For example, fans are generally mounted behind servers in the server cabinet. Cables are provided for connecting the fans and servers. A large number of cables makes manual operations on the server troublesome. A cable management assembly (CMA for short) can be applied to cables. Regular CMA is used to avoid interference with Nodes in multiple Nodes Servers. When the CMA is in a non-working position, cables can be disconnected or destroyed when operator pulls out chassis. A better protective apparatus is needed.

BRIEF DESCRIPTION OF THE DRAWINGS

Implementations of the present disclosure will now be described, by way of example only, with reference to the attached figures.

DETAILED DESCRIPTION

Figure 1:
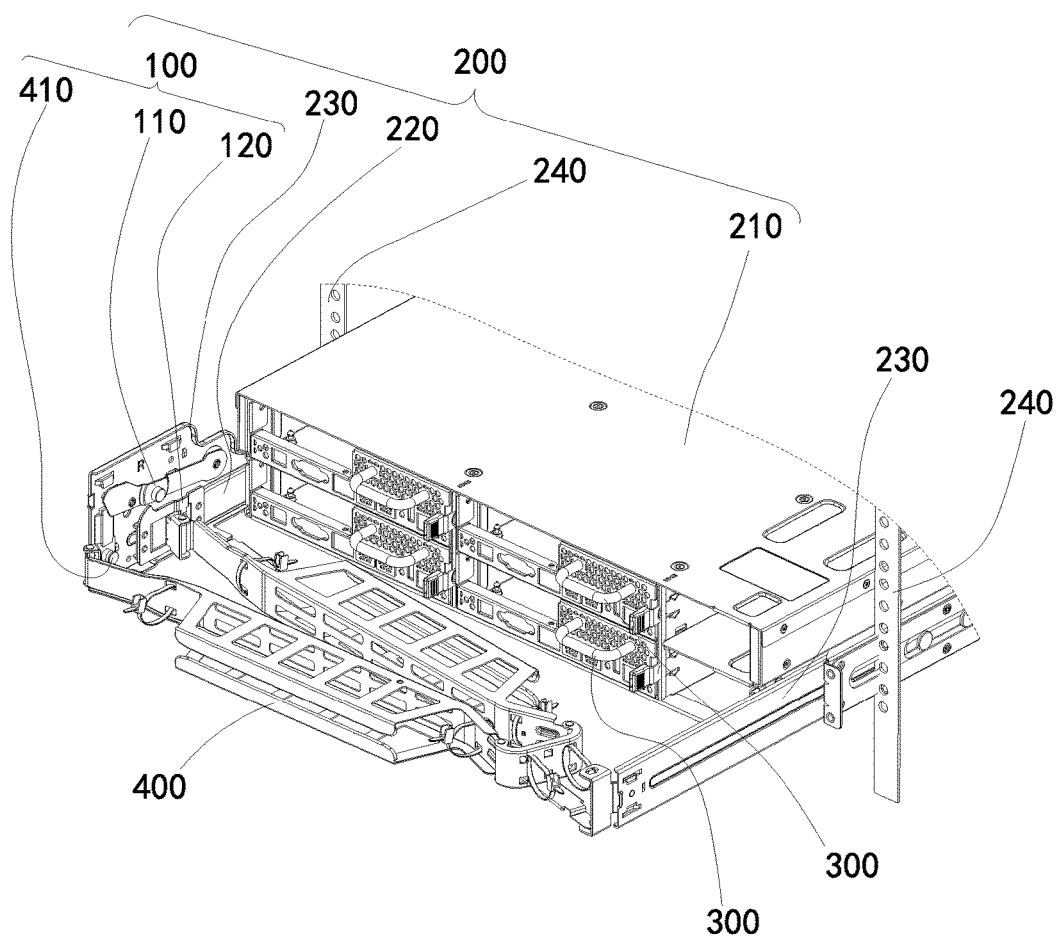
FIG. 1 illustrates a view of an embodiment of part of a server.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
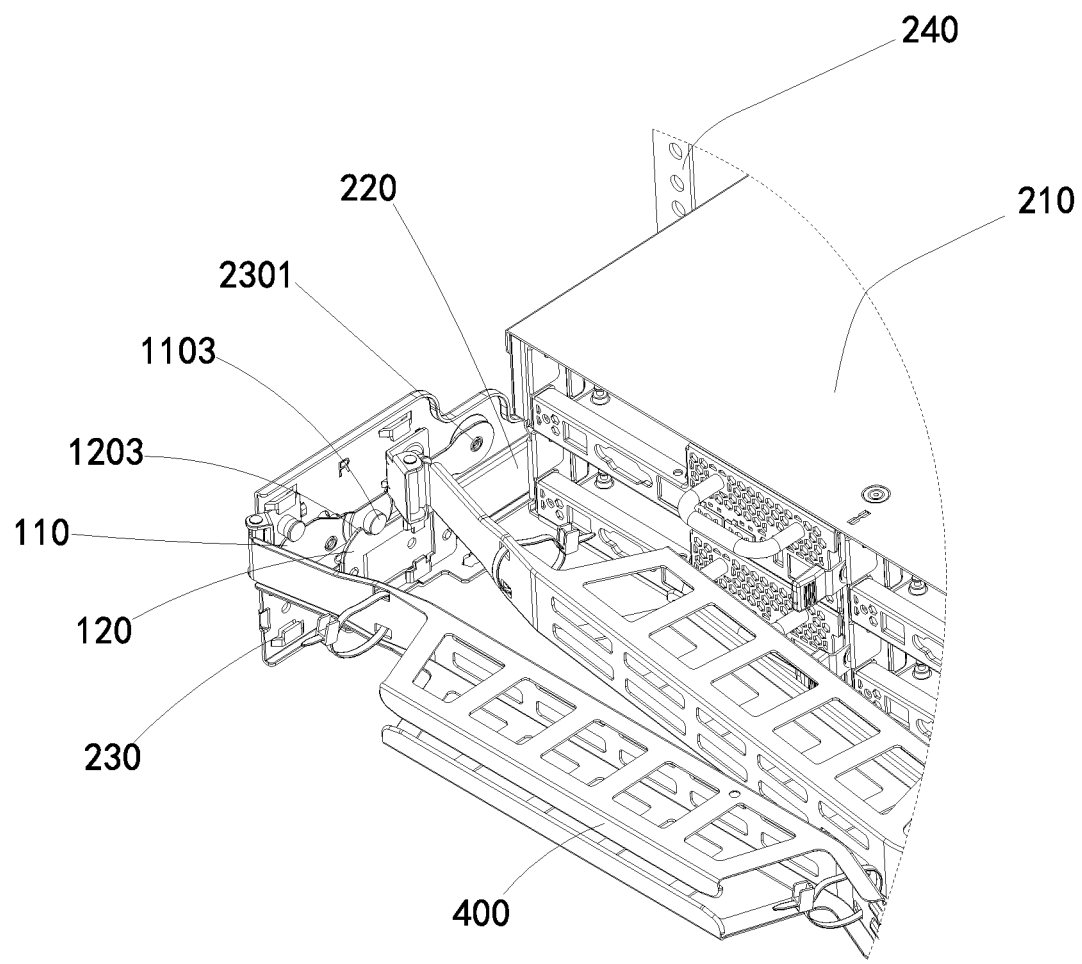
FIG. 2 illustrates another view of the server of FIG. 1.

FIGS. 1 to 2 illustrate a server 500. The server 500 includes a casing 200, a plurality of server units 300 and a cable managing assembly 400.

The casing 200 contains the server units 300.

The casing 200 includes a sliding bracket 210 and a protecting apparatus 100.

The protecting apparatus 100 is used between the cable managing assembly 400 and the sliding bracket 210.

The cable managing assembly 400 is switchable between a working position (as shown in FIG. 1) and a nonworking position (as shown in FIG. 2).

The sliding bracket 210 is slidable relative to the cable managing assembly 400, the server units 300 are installed in the sliding bracket 210, and the server units 300 can be moved relative to the cable managing assembly 400 along with the sliding bracket 210.

Figure 3:
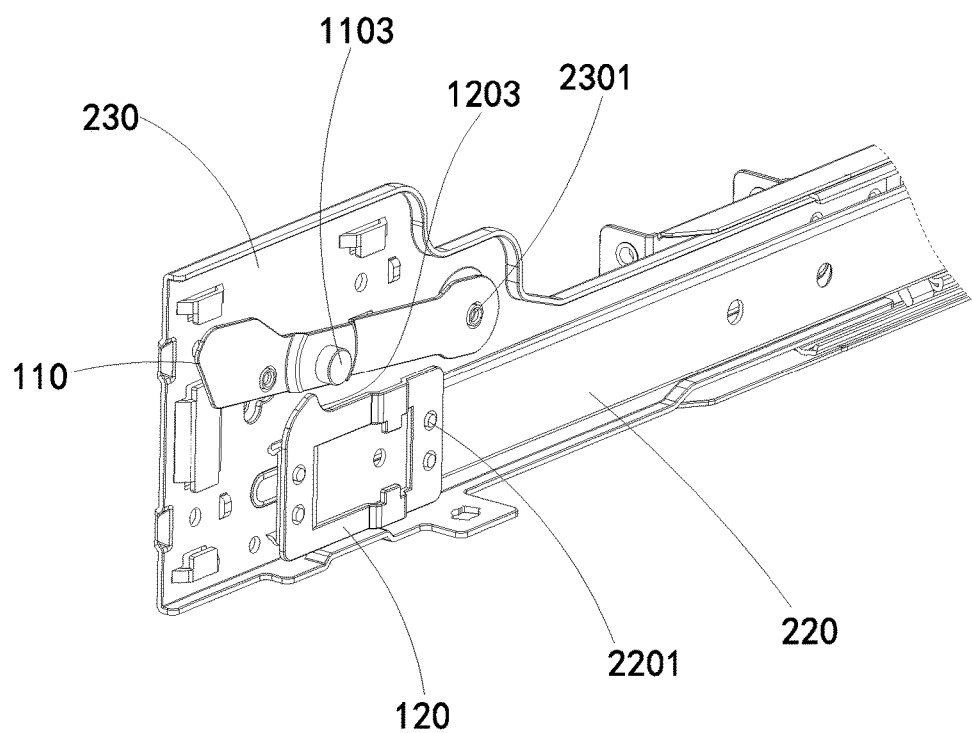
FIG. 3 illustrates a view of a protecting apparatus applied to the server of FIG. 1.
Figure 4:
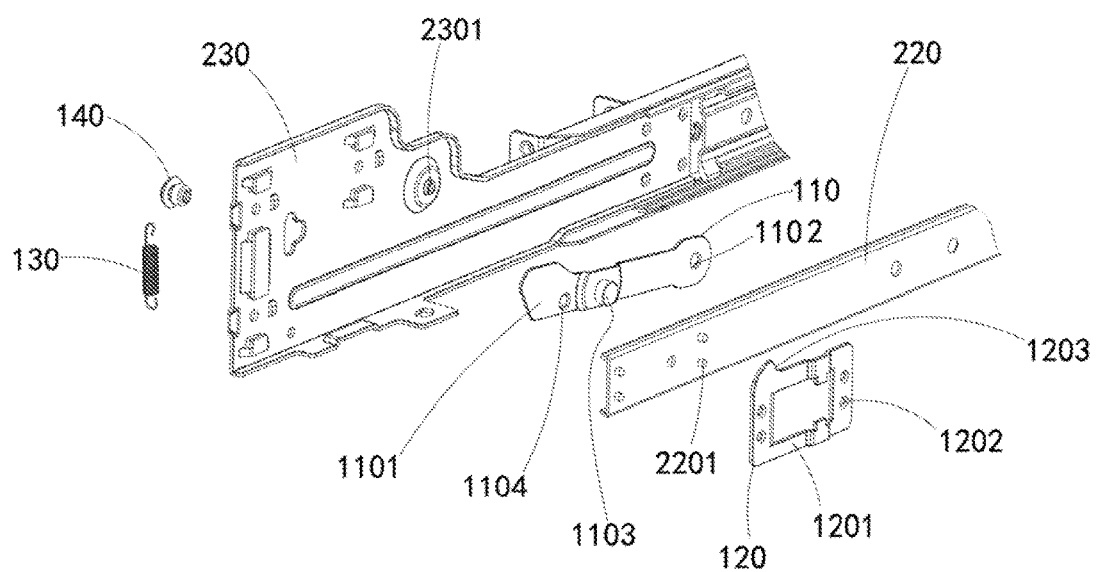
FIG. 4 illustrates an exploded view of the protecting apparatus of FIG. 3.

Referring also to FIGS. 3-4, the protecting apparatus 100 can include a locking member 110, a latching member 120, and a latching portion 410.

The locking member 110 includes two opposing ends, one of the two opposing ends is rotatably mounted to the casing 200, and the other end defines a locking pin 1103.

The latching member 120 is mounted to the sliding bracket 210, the latching member 120 defines a latching slope 1203 corresponding to the locking pin 1103.

The latching portion 410 is defined on the cable managing assembly 400 and the latching portion 410 corresponds to the locking member 110.

When the cable managing assembly 400 is moved to the working position, the latching portion 410 separates from the locking member 110, and the latching member 120 releases the locking member 110, the sliding bracket 210 is thus set free to move.

When the cable managing assembly 400 is moved to the nonworking position, the latching portion 410 resists against the locking member 110 and prevents the locking member 410 from rotating. The locking member 410 locks the latching member 120 and prevents the sliding bracket 210 from moving.

The locking member 110 can further include a cantilever 1101. The cantilever 1101 includes two opposing ends, in which one end of the cantilever 1101 defines a pivot hole 1102. The locking pin 1103 is defined on the other end of the cantilever 1101. The cantilever 1101 is rotatably mounted to the casing 200 through the pivot hole 1102.

The latching member 120 can include a latching plate 1201. The latching plate 1201 defines a mounting hole 1202, the latching plate 1201 is mounted to the sliding bracket 210 through the mounting hole 1202.

The latching slope 1203 is defined on a peripheral side of the latching plate 1201.

When the latching member 120 releases the locking member 110 and the sliding bracket 210 is moved, the latching slope 1203 resists against the locking member 110 and drives the locking member 110 to rotate until the locking pin 1103 separates from the latching slope 1203.

When the latching member 120 is resisted by the latching portion 410 and the locking member 110 is prevented from rotating, the latching slope 1203 is resisted by the locking pin 1103 and the locking pin 1103 prevents the sliding bracket 210 from moving.

The protecting apparatus 100 can further include a screw 140 mounted to the free end of the cantilever 1101 and an elastic member 130 connected between the screw 140 and the casing 200.

When the latching slope 1203 resists against the locking member 110 and drives the locking member 110 to rotate until the locking pin 1103 separates from the latching slope 1203, and the elastic member 130 is elastically deformed.

When the locking member 110 rotates to a position where the latching slope 1203 is resisted by the locking pin 1103, the elastic member 130 restores to keep the locking pin 1103 against the latching slope 1203.

The free end of the cantilever 1101 defines a screw hole 1104 corresponding to the screw 140.

The casing 200 can further include an outer rail 230 and an inner rail 220 slidably mounted to an inner side of the outer rail 230.

The latching member 120 is mounted to an end of the inner rail 220. The locking member 110 is rotatably mounted to the outer rail 230. The sliding bracket 210 is mounted to the inner rail 220.

When the inner rail 220 slides relative to the outer rail 230, the sliding bracket 210 slides along with the inner rail 220.

The casing 200 can further include a supporting bracket 240, the outer rail 230 being mounted to the supporting bracket 240.

The latching member 120 can define a fixing hole 1202. One end of the inner rail 220 includes a fixing pillar 2201 which corresponds to the fixing hole 1202. The latching member 120 is mounted to the end of the inner rail 220 through the fixing hole 1202 and the fixing pillar 2201.

The embodiments are only used to illustrate the technical solutions of the present disclosure and are not limited thereto. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A protecting apparatus used between a cable managing assembly and a sliding bracket, wherein the cable managing assembly is switchable between a working position and a nonworking position, the sliding bracket is slidable relative to the cable managing assembly, the protecting apparatus comprising:
    a locking member comprising two opposing ends, one of the two opposing ends is rotatably mounted to a casing, the other end defines a locking pin;
    a latching member mounted to the sliding bracket, the latching member defines a latching slope corresponding to the locking pin; and
    a latching portion defined on the cable managing assembly and corresponding to the locking member
    wherein:
        when the cable managing assembly is moved to the working position, the latching portion separates with the locking member and the latching member releases the locking member, the sliding bracket is set free to move; and
        when the cable managing assembly is moved to the nonworking position, the latching portion resists against the locking member and prevents the locking member from rotating, the locking member locks the latching member and prevents the sliding bracket from moving;
    wherein the locking member further comprises a cantilever comprising two opposing ends, one end of the cantilever defines a pivot hole, the locking pin is defined on the other end of the cantilever, the cantilever is rotatably mounted to the casing through the pivot hole, the latching member comprises a latching plate defining a mounting hole, the latching plate is mounted to the sliding bracket through the mounting hole; the latching slope is defined on a peripheral side of the latching plate; when the latching member releases the locking member and the sliding bracket is moved, the latching slope resists against the locking member and drives the locking member to rotate until the locking pin separates from the latching slope; when the latching member is resisted by the latching portion and the locking member is prevented from rotating, the latching slope is resisted by the locking pin and the locking pin prevents the sliding bracket from moving.

2. The protecting apparatus of claim 1, wherein the protecting apparatus further comprises:
    a screw mounted to the free end of the cantilever; and
    an elastic member connected between the screw and the casing;
    when the latching slope resists against the locking member and drives the locking member to rotate until the locking pin separates with the latching slope, the elastic member is elastically deformed;
    when the locking member rotates to a position that the latching slope is resisted by the locking pin, the elastic member keeps the locking pin to the latching slope under restoring force.

3. The protecting apparatus of claim 2, wherein the free end of the cantilever defines a screw hole corresponding to the screw.

4. A casing comprising:
    a sliding bracket; and
    a protecting apparatus used between a cable managing assembly and the sliding bracket, wherein the cable managing assembly is switchable between a working position and a nonworking position, the sliding bracket is slidable relative to the cable managing assembly, the protecting apparatus comprising:
        a locking member comprising two opposing ends, one of the two opposing ends is rotatably mounted to a casing, the other end defines a locking pin;
        a latching member mounted to the sliding bracket, the latching member defines a latching slope corresponding to the locking pin; and
        a latching portion defined on the cable managing assembly and corresponding to the locking member;
        wherein:
            when the cable managing assembly is moved to the working position, the latching portion separates with the locking member and the latching member releases the locking member, the sliding bracket is set free to move; and
            when the cable managing assembly is moved to the nonworking position, the latching portion resists against the locking member and prevents the locking member from rotating, the locking member locks the latching member and prevents the sliding bracket from moving;
    wherein the casing further comprises an outer rail and an inner rail slidably mounted to an inner side of the outer rail; the latching member is mounted to an end of the inner rail; the locking member is rotatably mounted to the outer rail; the sliding bracket is mounted to the inner rail;
    when the inner rail slides relative to the outer rail, the sliding bracket slides along with the inner rail; the latching member defines a fixing hole; an end of the inner rail comprises a fixing pillar corresponding to the fixing hole, the latching member is mounted to the end of the inner rail through the fixing hole and the fixing pillar.

5. The casing of claim 4, wherein the locking member further comprises a cantilever comprising two opposing ends, one end of the cantilever defines a pivot hole, the locking pin is defined on the other end of the cantilever; the cantilever is rotatably mounted to the casing through the pivot hole.

6. The casing of claim 5, wherein the latching member comprises a latching plate defining a mounting hole, the latching plate is mounted to the sliding bracket through the mounting hole; the latching slope is defined on a peripheral side of the latching plate;
when the latching member releases the locking member and the sliding bracket is moved, the latching slope resists against the locking member and drives the locking member to rotate until the locking pin separates with the latching slope;
when the latching member is resisted by the latching portion and the locking member is prevented from rotating, the latching slope is resisted by the locking pin and the locking pin prevent the sliding bracket from moving.

7. The casing of claim 6, wherein the protecting apparatus further comprises:
a screw mounted to the free end of the cantilever; and
an elastic member connected between the screw and the casing;
when the latching slope resists against the locking member and drives the locking member to rotate until the locking pin separates with the latching slope, the elastic member is elastically deformed;
when the locking member rotates to a position that the latching slope is resisted by the locking pin, the elastic member keeps the locking pin to the latching slope under restoring force.

8. The casing of claim 7, wherein the free end of the cantilever defines a screw hole corresponding to the screw.

9. The casing of claim 4, wherein the casing further comprises a supporting bracket, the outer rail is mounted to the supporting bracket.

10. A server comprising:
a plurality of server units;
a cable managing assembly; and
a casing for installing the server units, comprising:
a sliding bracket; and
a protecting apparatus used between the cable managing assembly and the sliding bracket, wherein the cable managing assembly is switchable between a working position and a nonworking position, the sliding bracket is slidable relative to the cable managing assembly, the protecting apparatus comprising:
a locking member comprising two opposing ends, one of the two opposing ends is rotatably mounted to a casing, the other end defines a locking pin;
a latching member mounted to the sliding bracket, the latching member defines a latching slope corresponding to the locking pin; and
a latching portion defined on the cable managing assembly and corresponding to the locking member wherein:
when the cable managing assembly is moved to the working position, the latching portion separates with the locking member and the latching member releases the locking member, the sliding bracket is set free to move; and
when the cable managing assembly is moved to the nonworking position, the latching portion resists against the locking member and prevents the locking member from rotating, the locking member locks the latching member and prevents the sliding bracket from moving;
wherein the locking member further comprises a cantilever comprising two opposing ends, one end of the cantilever defines a pivot hole, the locking pin is defined on the other end of the cantilever; the cantilever is rotatably mounted to the casing through the pivot hole; the latching member comprises a latching plate defining a mounting hole, the latching plate is mounted to the sliding bracket through the mounting hole; the latching slope is defined on a peripheral side of the latching plate; when the latching member releases the locking member and the sliding bracket is moved, the latching slope resists against the locking member and drives the locking member to rotate until the locking pin separates from the latching slope; when the latching member is resisted by the latching portion and the locking member is prevented from rotating, the latching slope is resisted by the locking pin and the locking pin prevents the sliding bracket from moving.

11. The server of claim 10, wherein the protecting apparatus further comprises:
a screw mounted to the free end of the cantilever; and
an elastic member connected between the screw and the casing;
when the latching slope resists against the locking member and drives the locking member to rotate until the locking pin separates with the latching slope, the elastic member is elastically deformed;
when the locking member rotates to a position that the latching slope is resisted by the locking pin, the elastic member keeps the locking pin to the latching slope under restoring force.

12. The server of claim 11, wherein the free end of the cantilever defines a screw hole corresponding to the screw.

13. The server of claim 10, wherein the casing further comprises:
an outer rail; and
an inner rail slidably mounted to an inner side of the outer rail;
the latching member is mounted to an end of the inner rail; the locking member is rotatably mounted to the outer rail; the sliding bracket is mounted to the inner rail;
when the inner rail slides relative to the outer rail, the sliding bracket slides along with the inner rail.

14. The server of claim 13, wherein the casing further comprises a supporting bracket, the outer rail is mounted to the supporting bracket.

* * * * *